(12) United States Patent
Tsai et al.

(10) Patent No.: US 8,945,821 B2
(45) Date of Patent: Feb. 3, 2015

(54) METHOD FOR PATTERNING FLEXIBLE SUBSTRATE

(71) Applicant: Industrial Technology Research Institute, Hsinchu (TW)

(72) Inventors: Pao-Ming Tsai, Kaohsiung (TW); Yu-Yang Chang, Hsinchu County (TW); Liang-You Jiang, New Taipei (TW); Yu-Jen Chen, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/487,047

(22) Filed: Sep. 15, 2014

(65) Prior Publication Data

US 2015/0004549 A1 Jan. 1, 2015

Related U.S. Application Data

(62) Division of application No. 13/103,943, filed on May 9, 2011, now Pat. No. 8,859,055.

(60) Provisional application No. 61/379,283, filed on Sep. 1, 2010.

(51) Int. Cl.
G03F 7/20 (2006.01)
G03F 7/34 (2006.01)

(52) U.S. Cl.
CPC .............. *G03F 7/343* (2013.01); *G03F 7/2016* (2013.01)
USPC ...................................... 430/325

(58) Field of Classification Search
USPC ........................... 430/322, 325, 5
See application file for complete search history.

(56) References Cited

U.S. PATENT DOCUMENTS

| 6,130,171 | A | 10/2000 | Gomi |
| 6,284,050 | B1 | 9/2001 | Shi et al. |
| 6,547,977 | B1 | 4/2003 | Yan et al. |
| 7,255,919 | B2 | 8/2007 | Sakata et al. |
| 2007/0065993 | A1 | 3/2007 | Wong et al. |
| 2007/0105473 | A1 | 5/2007 | Lee et al. |

(Continued)

FOREIGN PATENT DOCUMENTS

| TW | 200514486 A | 4/2005 |
| TW | M387451 | 8/2010 |

OTHER PUBLICATIONS

S. Selvarasah et al., "A High Aspect Ratio, Flexible, Transparent and Low-Cost Parylene-C Shadow Mask Technology for Micropatterning Applications," Jun. 2007, pp. 533-536, IEEE, US.

(Continued)

*Primary Examiner* — Brittany Raymond

(57) ABSTRACT

The invention provides a method for patterning a flexible substrate. The method for patterning a flexible substrate includes providing a carrier substrate. A release layer is formed on the carrier substrate. A flexible substrate film is formed on the release layer. A plurality of UV blocking mask patterns is formed covering various portions of the flexible substrate film and the release layer. A UV lighting process is performed to expose the flexible substrate film and the release layer not covered by the UV blocking mask patterns, to a UV light. A debonding step is performed so that the various portions of the flexible substrate film directly above the various portions of the release layer, which were not exposed to the UV light, are separated from the carrier substrate.

6 Claims, 19 Drawing Sheets

(56) References Cited

U.S. PATENT DOCUMENTS

2007/0117289 A1   5/2007   Akiyama
2010/0143708 A1   6/2010   Liao et al.

OTHER PUBLICATIONS

Russell R. A. Callahan et al., "Downstream Oxygen Etching Characteristics of Polymers from the Parylene Family," Jul. 2003, pp. 1495-1500, Other Nanotechnology Publications, US.

Robert D. Tacito et al., "Fine-Line Patterning of Parylene-n by Reactive Ion Etching for Application as an Interlayer Dielectric," J. Electrochem. Soc., Jun. 1996, pp. 1974-1977, vol. 143, No. 6, The Electrochemical Society, Inc., US.

Ellis Meng et al., "Parylene Etching Techniques for Microfluidics and BioMEMS," Micro Electro Mechanical Systems, Feb. 2005, pp. 568-571, IEEE, US.

Virginie Santucci et al., "Vapor Phase Surface Functionalization Under Ultra Violet Activation of Parylene Thin Films Grown by Chemical Vapor Deposition," Thin Solid Films, Jan. 2010, pp. 1675-1681, vol. 518, Issue 6, Elsevier B.V. US.

Taiwan Patent Office, Office Action, Patent Application Serial No. 100113653, May 28, 2013, Taiwan.

METHOD FOR PATTERNING FLEXIBLE SUBSTRATE

CROSS REFERENCE TO RELATED APPLICATIONS

This application is a division of U.S. patent application Ser. No. 13/103,943, filed May 9, 2011, which claims the benefit of U.S. Provisional Application No. 61/379,283 filed Sep. 1, 2010, the entirety of which are incorporated by reference herein.

BACKGROUND

1. Field of the Disclosure

The present disclosure relates to a method for patterning a flexible substrate, and in particular, to a method for patterning a flexible substrate by locally changing the adhesion force at an interface between a release layer and a flexible substrate.

2. Description of the Related Art

Flexible displays are popularly applied to portable electronic products due to their sturdiness, light weights, and thin structures. Additionally, flexible displays provide designers with greater degrees of freedom for designing with different shapes or curvatures.

For fabricating flexible display panels, a plurality of panels defined on a large-sized substrate is usually fabricated by processes of patterning a release layer formed of organic materials on a glass carrier. Next, a large-sized flexible substrate is coated on the patterned release layer. Next, the large-sized flexible substrate and the carrier are cut for separation into a plurality of small-sized flexible substrates. The cut flexible substrates have good adhesion with the glass carrier.

The conventional processes of patterning the release layer usually comprise an evaporation, laser patterning process, photolithography process or reactive ion etching (RIE). The evaporation process with a mask disposed on a carrier can directly form various independent release layer patterns. However, if the mask has poor adaptation with the carrier during the evaporation process, the release layer patterns fabricated by the evaporation process may diffuse and connect to each other. The laser process or photolithography process can prevent the release layer patterns from diffusing and connecting to each other. However, the laser patterning process and photolithography process would have low throughput. Specifically, an etched area of the patterned release layer by laser bombardment may easily generate particles, wherein the release layer has a poor profile. Fabrication yield therefore suffers from a contamination problem. The RIE process for patterning the release layer can prevent the contamination problem and improve throughput. However, the RIE process needs to use a photolithography process and higher process temperature; thereby decreasing fabrication yield. The conventional mask patterning process is used for patterning a release layer to prevent plasma etching problems. However, the patterned release layer has broken edges and the patterned release layer may be pulled up by masks.

Thus, a method for patterning a flexible substrate is provided.

BRIEF SUMMARY

A method for patterning a flexible substrate is provided. An exemplary embodiment of a method for patterning a flexible substrate comprises providing a carrier substrate. A release layer is formed on the carrier substrate. A flexible substrate film is formed on the release layer. A plurality of UV blocking mask patterns is formed covering various portions of the flexible substrate film and the release layer. A UV lighting process is performed to expose the flexible substrate film and the release layer not covered by the UV blocking mask patterns, to a UV light. A debonding step is performed so that the various portions of the flexible substrate film, directly above the release layer and not exposed to the UV light, are separated from the carrier substrate.

Another exemplary embodiment of a method for patterning a flexible substrate comprises providing a carrier substrate. A release layer is formed on the carrier substrate. A plurality of UV blocking mask patterns is formed covering various portions of the release layer. A flexible substrate film is formed covering the UV blocking mask patterns and the release layer. A UV lighting process is performed to expose the flexible substrate film and the release layer not covered by the UV blocking mask patterns, to a UV light. A debonding step is performed so that various portions of the flexible substrate film, directly above the release layer and not exposed to the UV light, are separated from the carrier substrate.

Yet another exemplary embodiment of a method for patterning a flexible substrate comprises providing a carrier substrate and forming a release layer on the carrier substrate. A plurality of UV blocking mask patterns is formed covering various portions of the release layer. A UV lighting process is performed to expose the portions of the release layer not covered by the UV blocking mask patterns, to a UV light. The UV blocking mask patterns are removed. A flexible substrate film is formed covering the release layer. A debonding step is performed so that various portions of the flexible substrate film, directly above the release layer and not exposed to the UV light, are separated from the carrier substrate.

A detailed description is given in the following embodiments with reference to the accompanying drawings.

BRIEF DESCRIPTION OF DRAWINGS

The disclosure can be more fully understood by reading the subsequent detailed description and examples with references made to the accompanying drawings, wherein.

DETAILED DESCRIPTION

Figure 1:
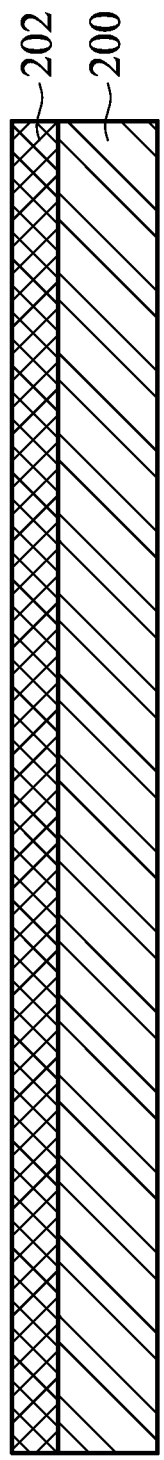
FIGS. 1 to 7 are cross sections showing one exemplary embodiment of a method for patterning a flexible substrate of the disclosure.

The following description is of a mode for carrying out the exemplary embodiments. This description is made for the purpose of illustrating the general principles of the disclosure and should not be taken in a limiting sense. The scope of the disclosure is best determined by reference to the appended claims. Wherever possible, the same reference numbers are used in the drawings and the descriptions to refer the same or like parts.

The present disclosure will be described with respect to particular embodiments and with reference to certain drawings, but the disclosure is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice of the disclosure.

FIGS. 1 to 7 are cross sections showing one exemplary embodiment of a method for patterning a flexible substrate of the disclosure. One exemplary embodiment of a flexible substrate may be used for a flexible electronic display, a flexible electronic touch panel, a flexible solar cell, a flexible electronic sensor, a flexible bioprobe or other flexible devices. As shown in FIG. 1, a carrier substrate 200 is provided. In one embodiment, the carrier substrate 200 may comprise a hard substrate such as a glass substrate, a silicon substrate, a quartz substrate, a sapphire substrate or a metal substrate. The hard substrate maintains an original shape without distortion even when moved or carried. Next, a release layer 202 is formed on the carrier substrate 200 by a formation method comprising vacuum evaporation or screen printing. The release layers 202 may allow the subsequently formed flexible substrate on the carrier substrate 200 to be separated from the carrier substrate 200 easily. The separation method is described in the following description. In one embodiment, the release layers 202 may comprise organic materials including Parylene group materials, for example, parylene c, parylene N or parylene F, with the C—H functional group. The identical recurring unit of the release layer 202 formed of parylene is formed by an identical recurring unit of formula 1, Formula 2 or Formula 3, wherein n>20.

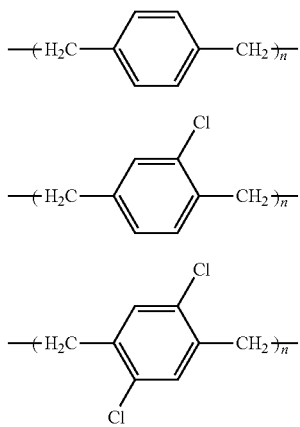

Figure 2:
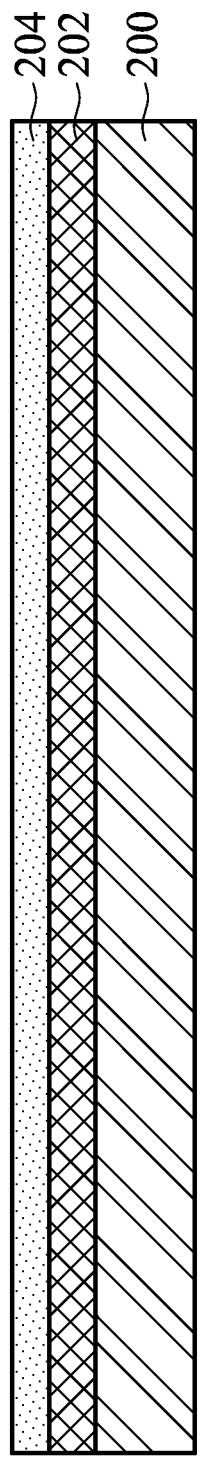

Next, referring to FIG. 2, a flexible substrate film 204 is formed on the release layer 202 by a formation method comprising screen printing, spatula printing, roller coating, spray printing, spin coating or slot die coating. Alternatively, a fabricated flexible substrate film 204 may be bond onto the release layer 202 via an adhesion layer (not shown). In one embodiment, the flexible substrate film 204 may comprise polymers, for example, polyimide (PI), polyethersulfone (PES), polyarylene ether nitrile (PEN) or other plastics. Alternatively, the flexible substrate film 204 may comprise an organic/inorganic hybrid material, which is composed by inorganic nanoparticles dispersed in organic polymers, wherein the organic polymers may comprise the aforementioned polymers, for example, polyimide (PI), polyethersulfone (PES), polyarylene ether nitrile (PEN) or other plastics, and the inorganic nanoparticles may comprise, for example, $SiO_2$ nanoparticles. In one embodiment, an area of the release layer 202 may be smaller than or equal to that of the flexible substrate film 204. Additionally, in one embodiment, an adhesion force between the release layer 202 and the carrier substrate 200 is larger than that between the release layer 202 and the flexible substrate film 204. Thus, the release layer 202 is used to allow the flexible substrate film 204 to be easily separated from the carrier substrate 200 during a subsequent debonding process.

Figure 3:
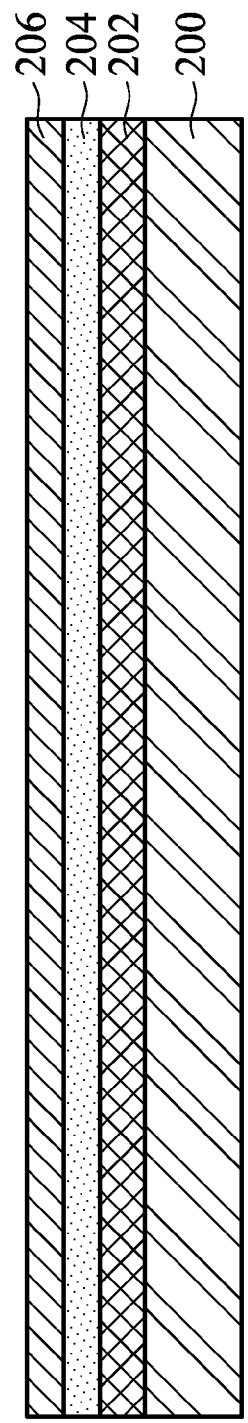

Next, referring to FIG. 3, a UV (ultraviolet, which has a wavelength range from 190 nm to 400 nm) blocking film 206 is formed on the flexible substrate film 204 and the release layer 202 by a formation method comprising screen printing, spatula printing, roller coating, spray printing or spin coating. In one embodiment, the UV blocking film 206 may prevent UV light from penetrating into the release layer 202 covered by the UV blocking film 206. The UV blocking film 206 may have various functions of, for example, UV resistant or UV absorption. The UV blocking film 206 may further have functions of electrical conduction or gas or hydraulic resistance. Therefore, the UV blocking film 206 may not only be used for blocking UV light with a wavelength between 190 nm and 400 nm, but also used as an element of a subsequent formed flexible device, for example, a gas barrier or hydraulic resistance layer, an electrode or the like. In one embodiment, the UV blocking film 206 may comprise inorganic materials including metals, metal oxides (such as $Al_2O_3$), silicon oxide or nitride compounds (such as SiOx or SiNx), organic materials including polymers, organic/inorganic laminating layers or organic/inorganic mixing layers. In one embodiment, the UV blocking film 206 may be a transparent film or an opaque film. In one embodiment, the UV blocking film 206 may comprise a single layer or multilayer film.

Figure 4:
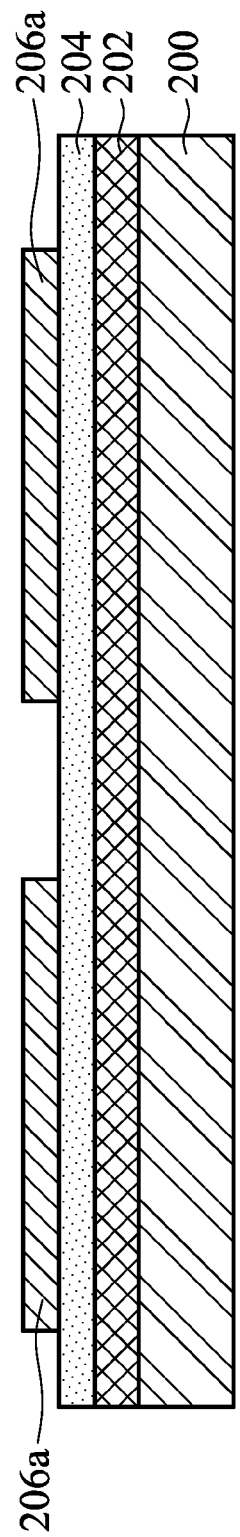

Next, referring to FIG. 4, a patterning process is performed to remove a portion of the UV blocking film 206; thereby forming a plurality of UV blocking mask patterns 206a separated from each other, wherein the UV blocking mask patterns 206a cover various portions of the flexible substrate film 204 and the underlying release layer 202. The various portions of the flexible substrate film 204 covered by the UV blocking mask patterns 206a are defined as various debonding portions of the flexible substrate film 204, which are separated from the carrier substrate 200 via the directly underlying portions of the release layer 202 during the subsequent debonding process.

Figure 5:
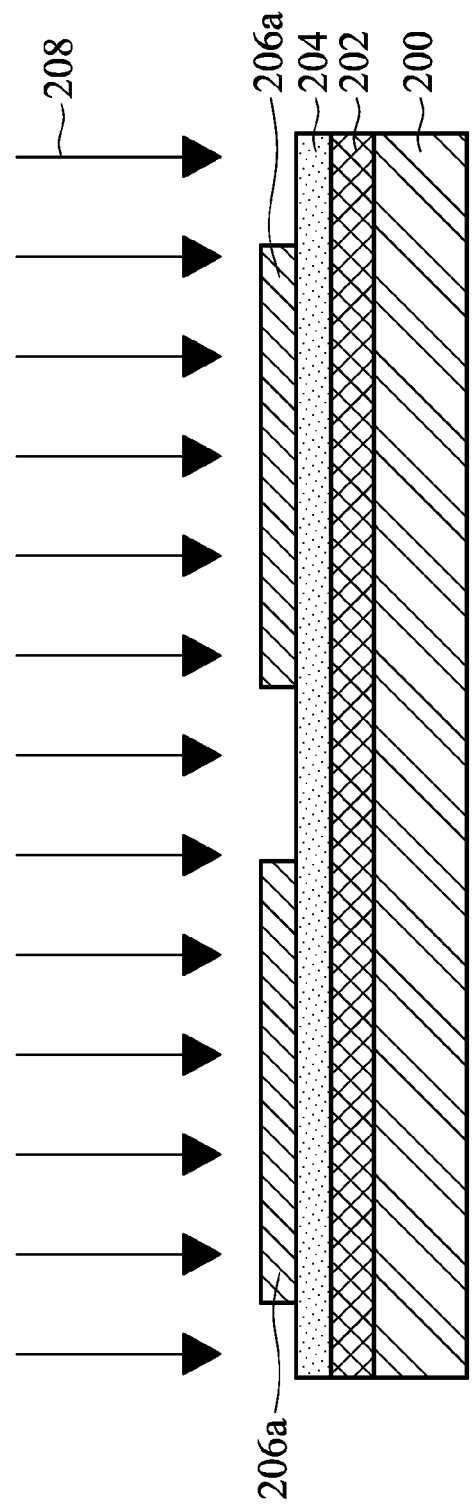

Next, referring to FIG. 5, a UV lighting process 208 is performed to expose the portions of the flexible substrate film 204 and the portions of the release layer 202 not covered by the UV blocking mask patterns 206a to UV light. Because the release layer 202 formed of organic materials absorbs UV light with a wavelength between 200 nm to 300 nm easily, but does not absorb the light with a wavelength above 400 nm. During the UV lighting process 208, a reaction occurs yellowing the portions of the release layer 202 not covered by the UV blocking mask patterns 206a (portions of the release layer 202 exposed to the UV light).

Figure 6:
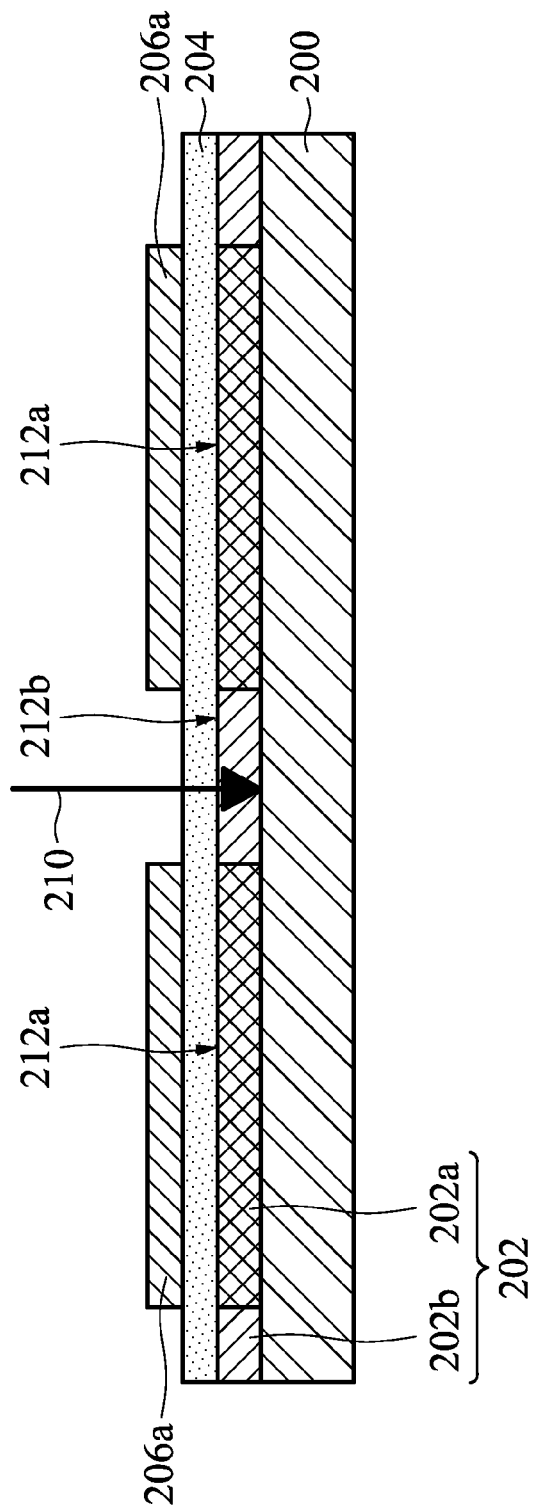

Next, referring to FIG. 6, the UV lighting process 208 locally changes the adhesion force at an interface between the release layer 202 and the flexible substrate film 204. After performing the UV lighting process 208, the portions of the release layer 202 not covered by the UV blocking mask patterns 206a may be transformed into UV treated release layer patterns 202b, and the portions of the release layer 202 covered by the UV blocking mask patterns 206a may be formed as release layer patterns 202a, wherein the UV treated release layer patterns 202b and the release layer patterns 202a are connected to each other. The reaction formula of the release layer 202 is shown as:

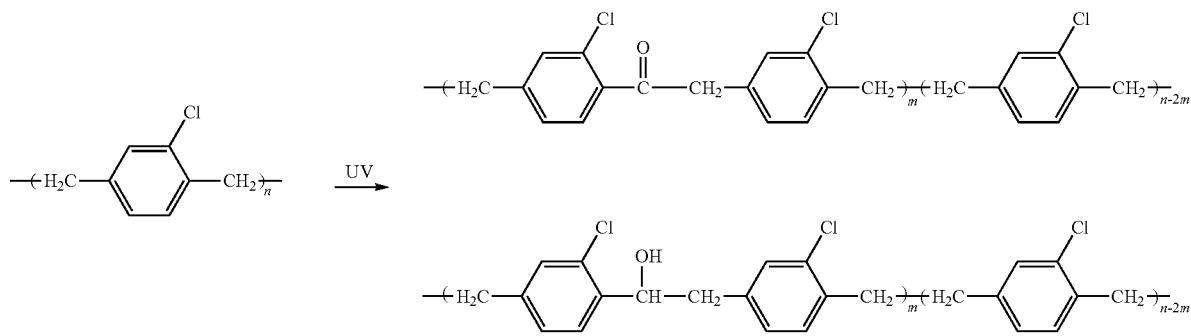

The UV treated release layer patterns 202b are formed by including formula 4 and formula 5.

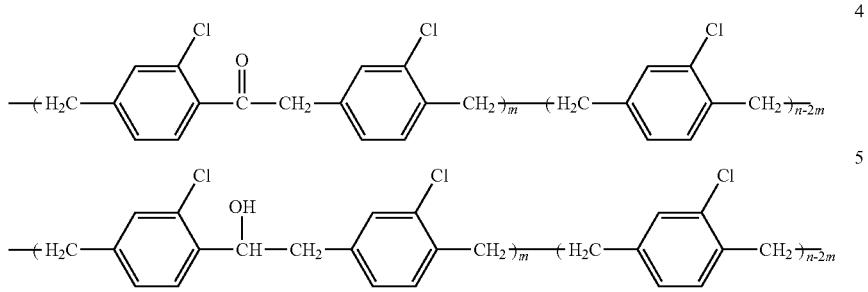

The C=O functional group of the formula 2 and the —OH functional group of the formula 3 of the UV treated release layer patterns 202b result in good adhesion force with the flexible substrate film 204. That is to say, the UV treated release layer patterns 202b do not have the function of allowing the flexible substrate directly thereon to be separated from the carrier substrate 200 easily. On the contrary, the release layer patterns 202a covered by the UV blocking mask patterns 206a still allow portions of the flexible substrate film 204, which are formed directly on the release layer patterns 202a, to be separated from the carrier substrate 200 easily.

Still referring to FIG. 6, a cutting process 210 is performed to cut the flexible substrate film 204, the UV treated release layer pattern 202b and the carrier substrate 200 in sequence to separate the flexible substrate film 204 into the independent flexible substrate films 204 with a smaller area at where the flexible substrate film 204 is exposed to the UV light. After performing the cutting process 210, each of the release layer patterns 202a covered by the UV blocking mask patterns 206a are separated from each other. In one embodiment, the cutting process 210 may be performed along a direction of the normal line of the carrier substrate 200. It is noted that the UV treated release layer pattern 202b has good adhesion force with the flexible substrate film 204 thereabove. Therefore, when performing the cutting process 210, a peeling problem at the interface 212b between the UV treated release layer pattern 202b and the flexible substrate film 204 thereabove, is not likely to occur.

Figure 7:
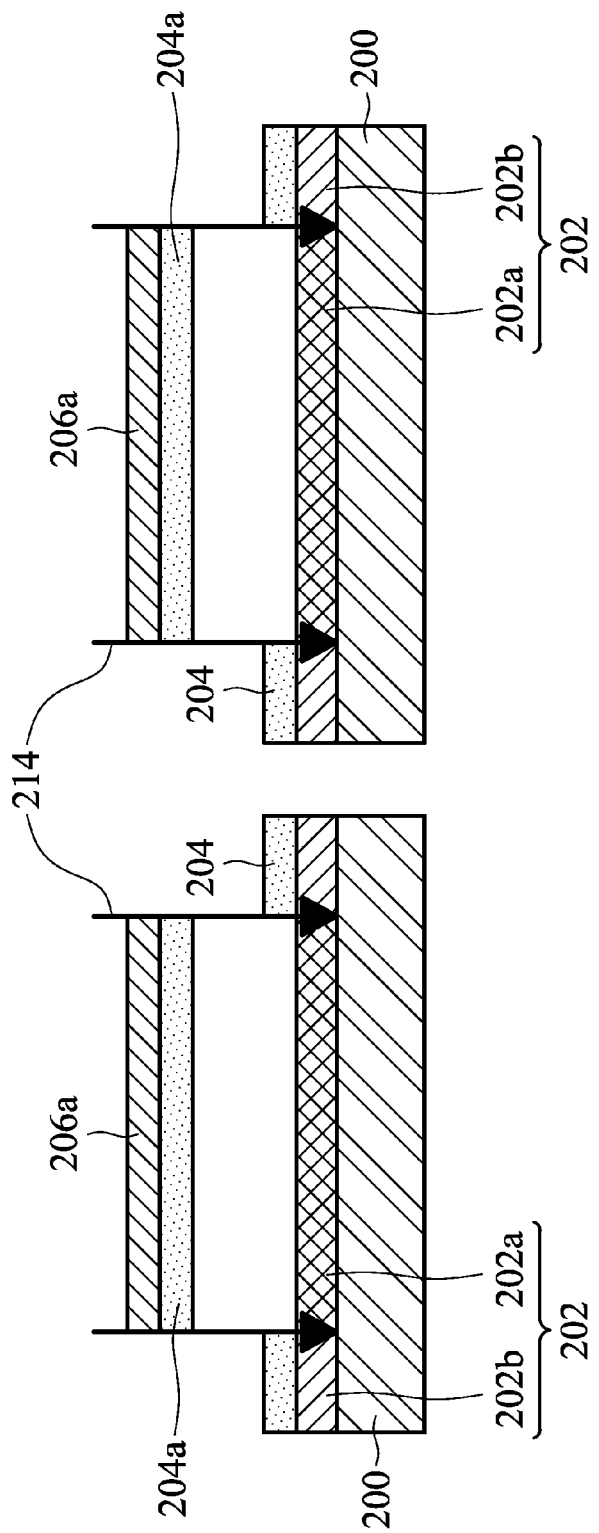

Next, referring to FIG. 7, a separating step 214 may be performed using a cutting tool to cut the flexible substrate film 204 and the release layer patterns 202a along edges of the UV blocking mask patterns 206a; thereby allowing air to enter into an interface 212a (as shown in FIG. 6) between the release layer patterns 202a and the flexible substrate film 204 covered by the UV blocking mask patterns 206a. Next, a debonding step is performed so that a plurality of flexible substrates 204a, which respectively connect the UV blocking mask patterns 206a together, directly above the release layer patterns 202a not exposed to the UV light, are separated from the carrier substrate 200. A remaining flexible substrate film 204 is left on the UV treated release layer pattern 202b due to good adhesion force therebetween. Thus, a description of one exemplary embodiment of a method for patterning a flexible substrate is complete.

Figure 8:
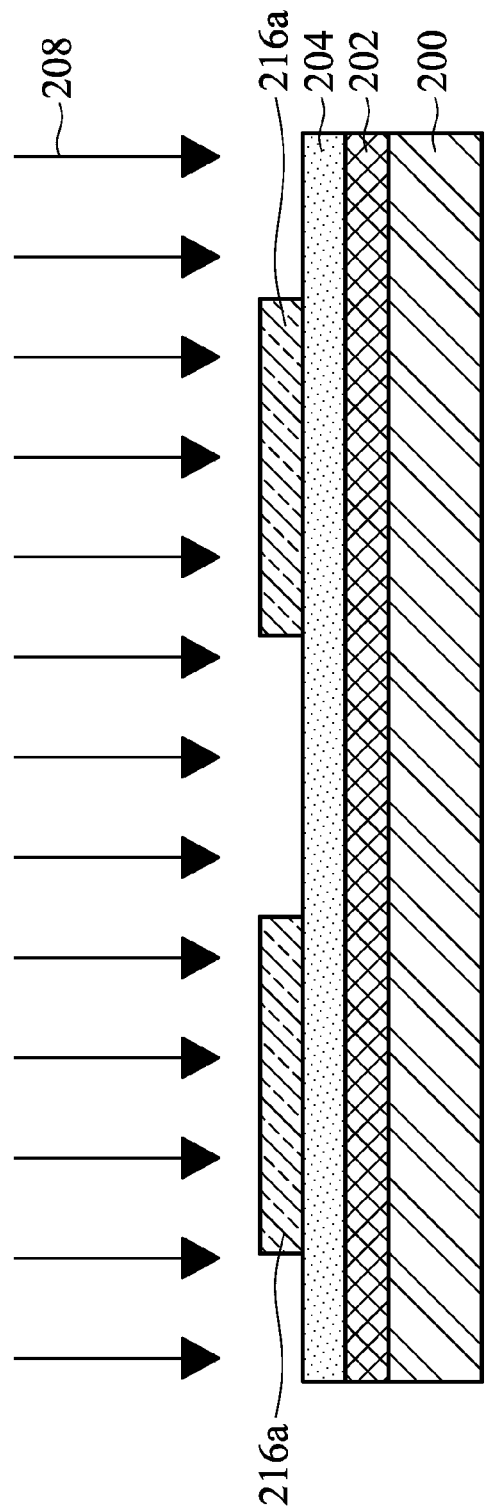
FIGS. 8 to 10 are cross sections showing another exemplary embodiment of a method for patterning a flexible substrate of the disclosure.
Figure 9:
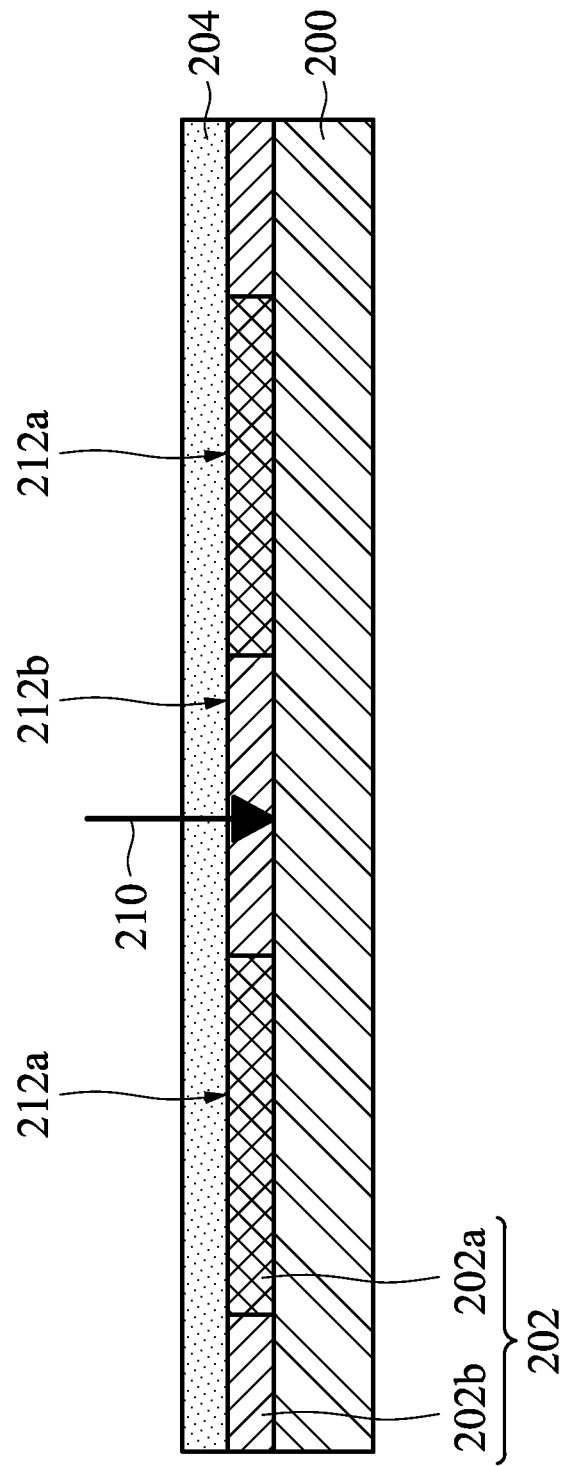
Figure 10:
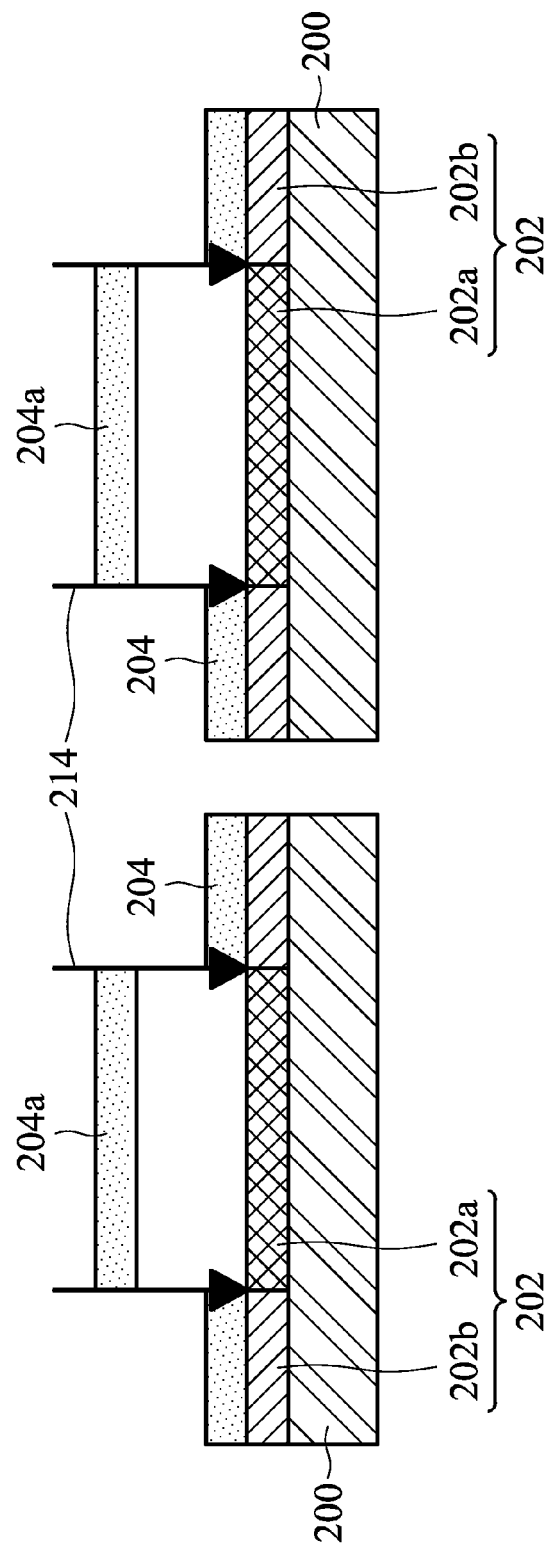

FIGS. 8 to 10 are cross sections showing another exemplary embodiment of a method for patterning a flexible substrate of the disclosure. Elements of the embodiments hereinafter, that are the same or similar as those previously described with reference to FIGS. 1 to 7, are not repeated for brevity. As shown in FIG. 8, a plurality of UV blocking mask patterns 216a is formed on various portions of the flexible substrate film 204 and the release layer 202 by a formation method comprising screen printing, spatula printing, roller coating, spray printing or spin coating. In this embodiment, the UV blocking mask patterns 216a may have functions of, for example, UV resistant or UV absorption. In one embodiment, the UV blocking patterns 216a may comprise inorganic materials including metals, metal oxides (such as $Al_2O_3$), silicon oxide or nitride compounds (such as SiOx or SiNx), organic materials including polymers, organic/inorganic laminating layers or organic/inorganic mixing layers. In one embodiment, the UV blocking mask patterns 216a may be a transparent film or an opaque film. In one embodiment, the UV blocking mask patterns 216a may comprise a signal layer or multilayer film. The various portions of the flexible substrate film 204 covered by the UV blocking mask patterns 216a are defined as various debonding portions of the flexible substrate film 204, which are separated from the carrier substrate 200 via the directly underlying portions of the release layer 202 during the subsequent debonding process.

Still referring to FIG. 8, a UV lighting process 208 is performed to expose the portions of the flexible substrate film 204 and the portions of the release layer 202 not covered by the UV blocking mask patterns 216a to a UV light. The release layer 202 formed of organic materials absorbs UV light with a wavelength between 200 nm to 300 nm easily, but does not absorb the light with a wavelength above 400 nm. During the UV lighting process 208, a yellowing reaction occurs yellowing the portions of the release layer 202 not covered by the UV blocking mask patterns 216a.

Next, referring to FIG. 9 the UV lighting process 208 locally changes the adhesion force at an interface between the release layer 202 and the flexible substrate film 204. After performing the UV lighting process 208, the UV blocking mask patterns 216a as shown in FIG. 8 are removed. Also, after performing the UV lighting process 208, the portions of the release layer 202 not covered by the UV blocking mask patterns 216a may be transformed into UV treated release layer patterns 202b, and the portions of the release layer 202 covered by the UV blocking mask patterns 216a may be formed as release layer patterns 202a, wherein the UV treated release layer patterns 202b and the release layer patterns 202a are connected to each other.

Still referring to FIG. 9, a cutting process 210 is performed to cut the flexible substrate film 204, the UV treated release layer pattern 202b and the carrier substrate 200 in sequence to separate the flexible substrate film 204 into the independent flexible substrate films 204 with a smaller area at where the flexible substrate film 204 is exposed to the UV light. After performing the cutting process 210, each of the release layer patterns 202a, which is not exposed to the UV light, are separated from each other. In one embodiment, the cutting process 210 may be performed along a direction of the normal line of the carrier substrate 200. It is noted that the UV treated release layer pattern 202b has good adhesion force with the flexible substrate film 204 thereabove. Therefore, when performing the cutting process 210, a peeling problem at the interface 212b between the UV treated release layer pattern 202b and the flexible substrate film 204 thereabove, is not likely to occur.

Next, referring to FIG. 10, a separating step 214 may be performed using a cutting tool to cut the flexible substrate film 204 along edges between the release layer patterns 202a and the UV treated release layer pattern 202b; thereby allowing air to enter into an interface 212a (as shown in FIG. 9) between the release layer patterns 202a and the flexible substrate film 204. Next, a debonding step is performed so that a plurality of flexible substrates 204a directly above the release layer patterns 202a not exposed to the UV light, are separated from the carrier substrate 200. A remaining flexible substrate film 204 is left on the UV treated release layer pattern 202b due to good adhesion force therebetween. Thus, a description of another exemplary embodiment of a method for patterning a flexible substrate is complete.

Figure 11:
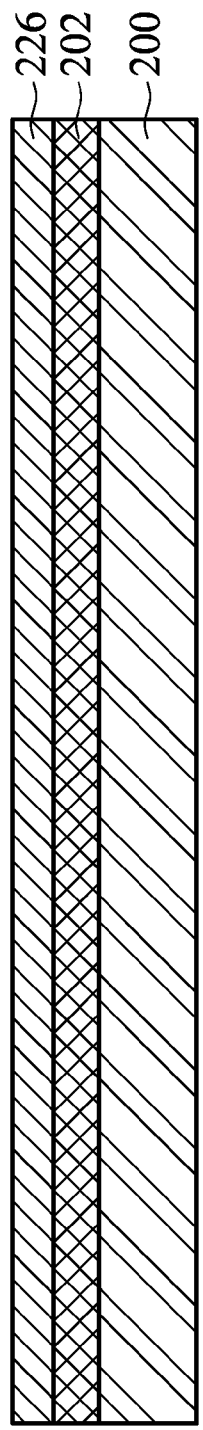
FIGS. 11 to 16 are cross sections showing yet another exemplary embodiment of a method for patterning a flexible substrate of the disclosure.

FIGS. 11 to 16 are cross sections showing yet another exemplary embodiment of a method for patterning a flexible substrate of the disclosure. Elements of the embodiments hereinafter, that are the same or similar as those previously described with reference to FIGS. 1 to 10, are not repeated for brevity. As shown in FIG. 11, after forming the release layer 202, a UV (ultraviolet, which has a wavelength range from 190 nm to 400 nm) blocking film 226 is formed on the release layer 202 by a formation method comprising screen printing, spatula printing, roller coating, spray printing or spin coating. The UV blocking film 226 may have various functions of, for example, UV resistant or UV absorption. The UV blocking film 226 may further have functions of electrical conduction or gas or hydraulic resistance. Therefore, the UV blocking film 226 may be used not only for blocking UV light with a wavelength between 190 nm and 400 nm, but also used as an element of a subsequent formed flexible device, for example, a gas barrier or hydraulic resistance layer, an electrode or the like. In one embodiment, the UV blocking film 226 may comprise inorganic materials including metals, metal oxides (such as $Al_2O_3$), silicon oxide or nitride compounds (such as SiOx or SiNx), organic materials including polymers, organic/inorganic laminating layers or organic/inorganic mixing layers. In one embodiment, the UV blocking film 226 may be a transparent film or an opaque film. In one embodiment, the UV blocking film 226 may comprise a single layer or multilayer film.

Figure 12:
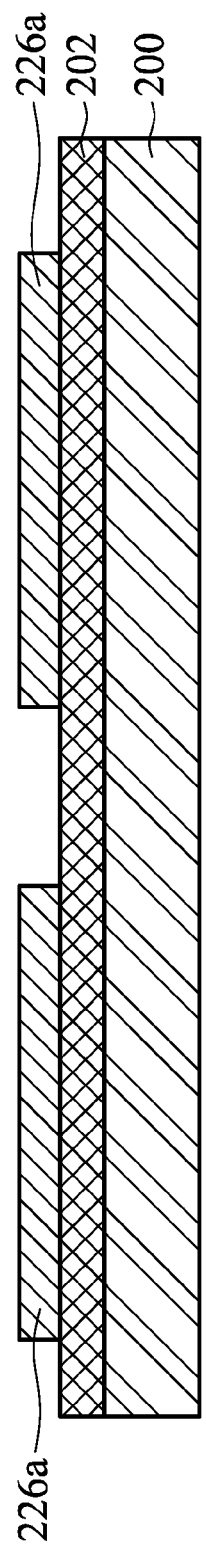

Next, referring to FIG. 12, a patterning process is performed to remove a portion of the UV blocking film 226; thereby forming a plurality of UV blocking mask patterns 226a separated from each other, wherein the UV blocking mask patterns 226a cover various portions of the underlying release layer 202.

Figure 13:
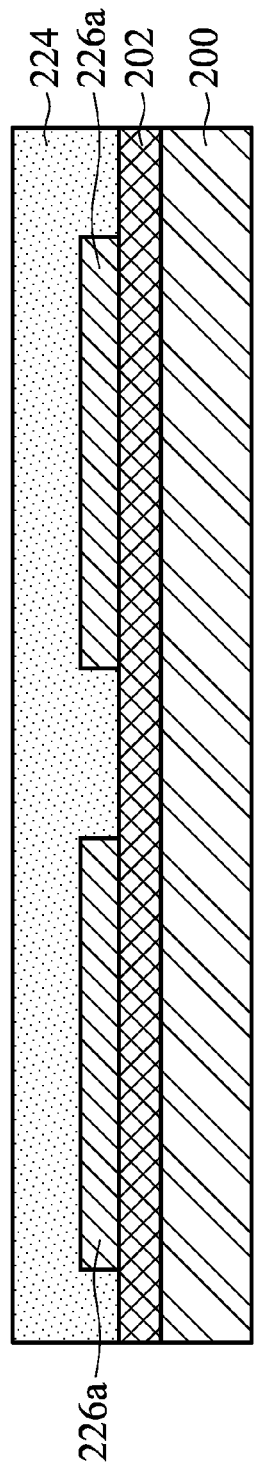

Next, referring to FIG. 13, a flexible substrate film 224 is formed covering the UV blocking mask patterns 226a and the release layer 202 by a formation method comprising screen printing, spatula printing, roller coating, spray printing, spin coating or slot die coating. The flexible substrate film 224 is thick enough, so that the flexible substrate film 224 has a planar surface. The various portions of the flexible substrate film 224 directly on the UV blocking mask patterns 226a are defined as various debonding portions of the flexible substrate film 204, which are separated from the carrier substrate 200 via portions of the release layer 202 directly underlying the UV blocking mask patterns 206a during the subsequent debonding process.

Figure 14:
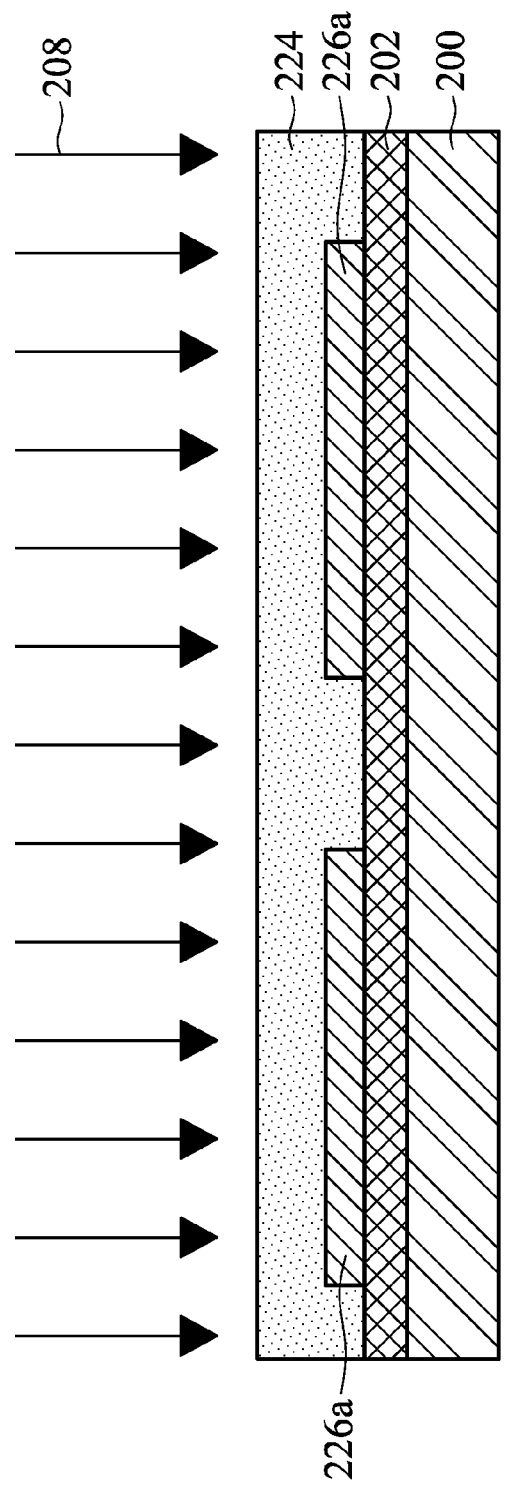

Next, referring to FIG. 14, a UV lighting process 208 is performed to expose the flexible substrate film 224 and the release layer 202, which is not covered by the UV blocking mask patterns 226a, to a UV light. The release layer 202 formed of organic materials absorbs UV light with a wavelength between 200 nm to 300 nm easily, but does not absorb the light with a wavelength above 400 nm. During the UV lighting process 208, a yellowing reaction occurs yellowing the portions of the release layer 202 not covered by the UV blocking mask patterns 226a.

Figure 15:
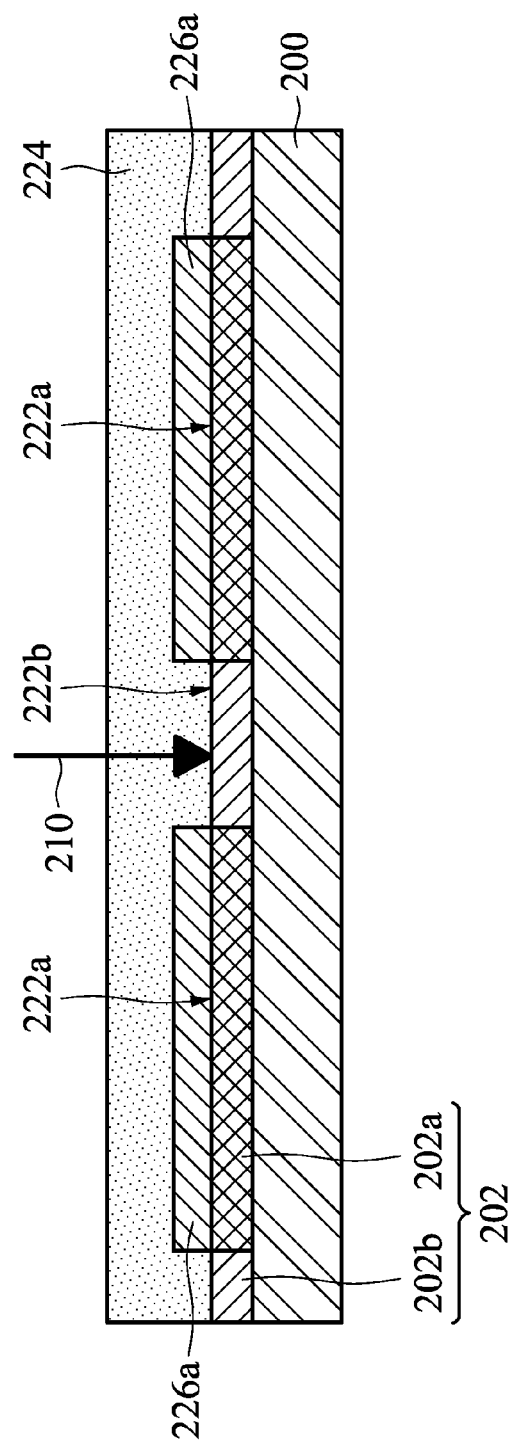

Next, referring to FIG. 15 the UV lighting process 208 locally changes the adhesion force at an interface between the release layer 202 and the flexible substrate film 224. After performing the UV lighting process 208, the portions of the release layer 202 not covered by the UV blocking mask patterns 226a may be transformed into UV treated release layer patterns 202b, and the portions of the release layer 202 covered by the UV blocking mask patterns 226a may be formed as release layer patterns 202a, wherein the UV treated release layer patterns 202b and the release layer patterns 202a are connected to each other.

Still referring to FIG. 15, a cutting process 210 is performed to cut the flexible substrate film 224, the UV treated release layer pattern 202b and the carrier substrate 200 in sequence to separate the flexible substrate film 224 into the independent flexible substrate films 224 with a smaller area at where the UV treated release layer patterns 202b are (where the release layer 202 exposed to the UV light). After performing the cutting process 210, each of the release layer patterns 202a cover by the UV blocking mask patterns 226a are separated from each other. In one embodiment, the cutting process 210 may be performed along a direction of the normal line of the carrier substrate 200. It is noted that the UV treated release layer pattern 202b has good adhesion force with the flexible substrate film 224 thereabove. Therefore, when performing the cutting process 210, a peeling problem at the interface 222b between the UV treated release layer pattern 202b and the flexible substrate film 224 thereabove, is not likely to occur.

Figure 16:
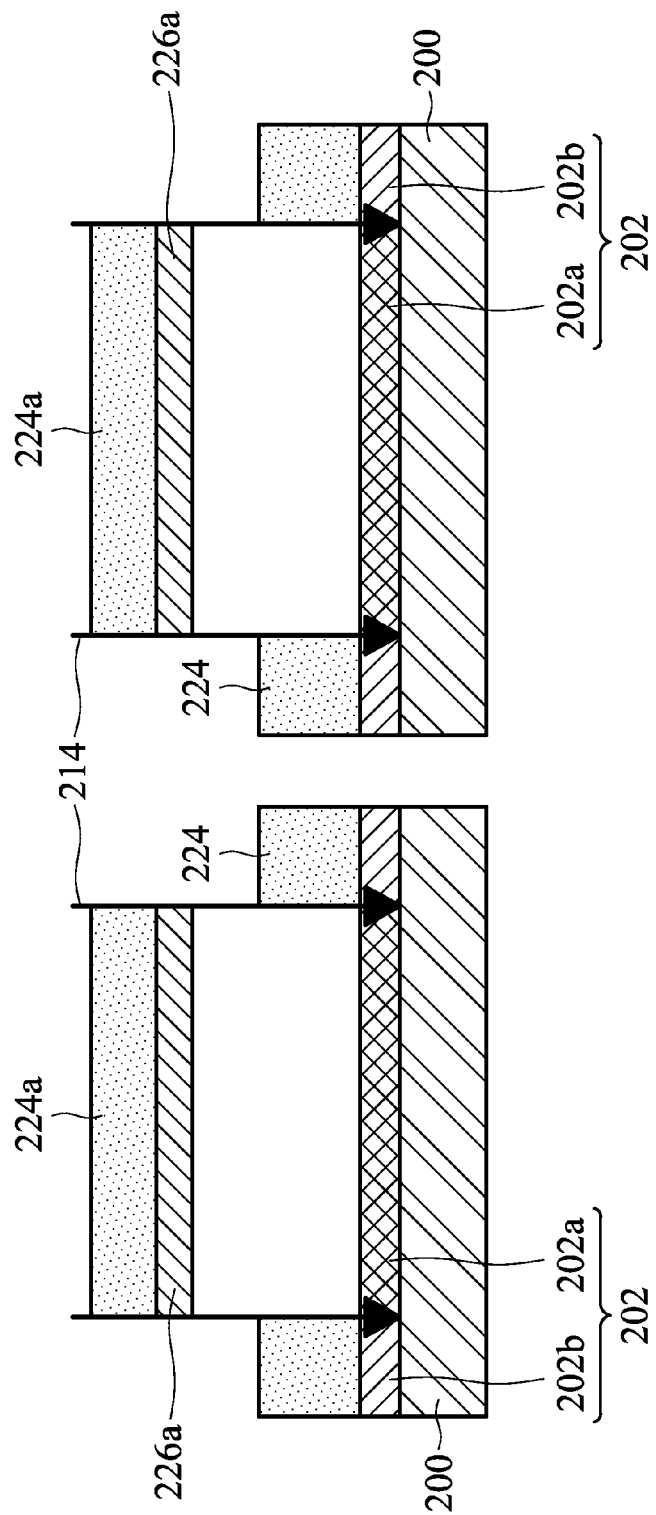

Next, referring to FIG. 16, a separating step 214 may be performed using a cutting tool to cut the flexible substrate film 224 along edges between the release layer patterns 202a and the UV treated release layer pattern 202b; thereby allowing air to enter into an interface 222a (as shown in FIG. 15) between the release layer patterns 202a and the UV blocking mask patterns 226a. Next, a debonding step is performed so that a plurality of flexible substrates 224a, which respectively connect to the UV blocking mask patterns 226a, directly above the release layer patterns 202a not exposed to the UV light, are separated from the carrier substrate 200. A remaining flexible substrate film 224 is left on the UV treated release layer pattern 202b due to good adhesion force therebetween. Thus, a description of yet another exemplary embodiment of a method for patterning a flexible substrate is complete.

Figure 17:
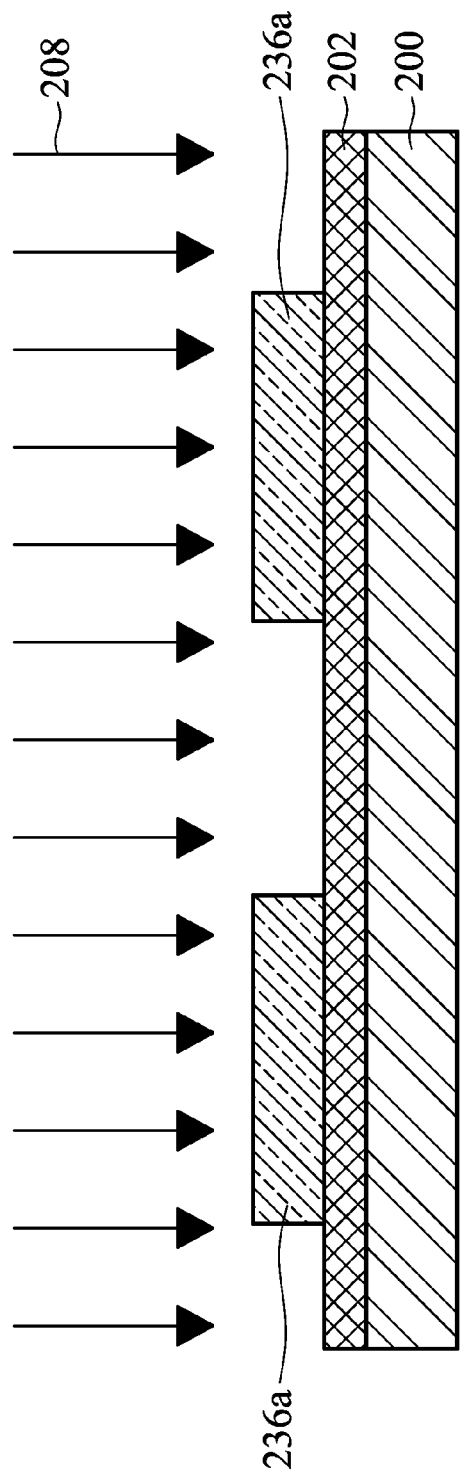
FIGS. 17 to 19 are cross sections showing still yet another exemplary embodiment of a method for patterning a flexible substrate of the disclosure.
Figure 18:
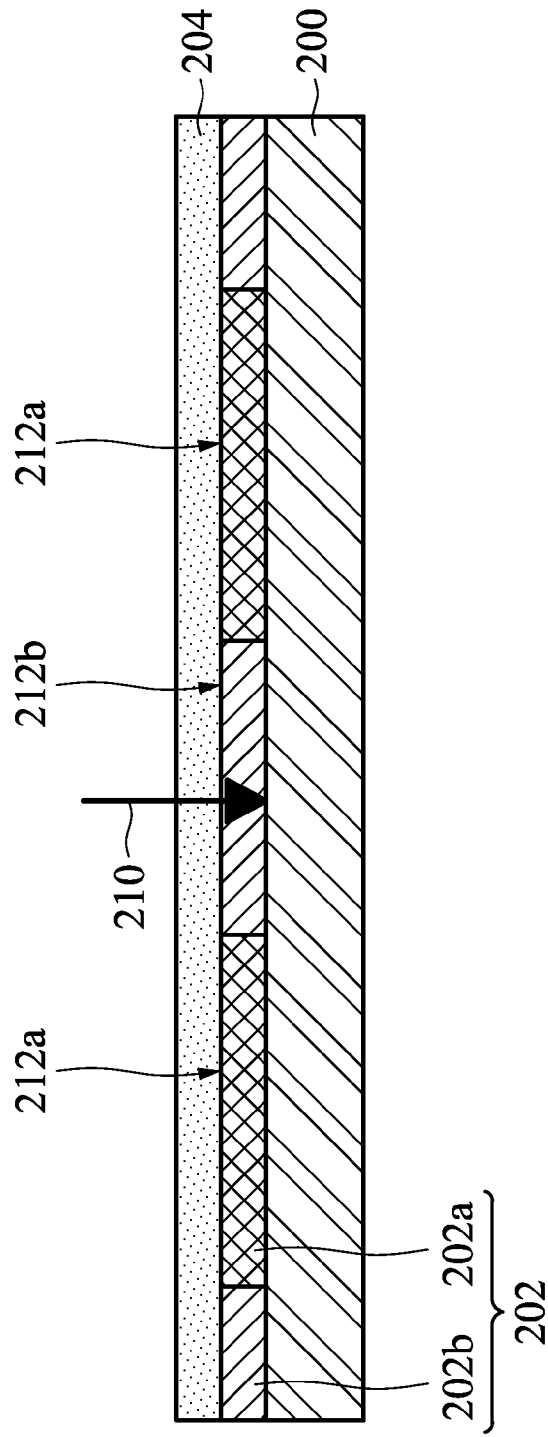
Figure 19:
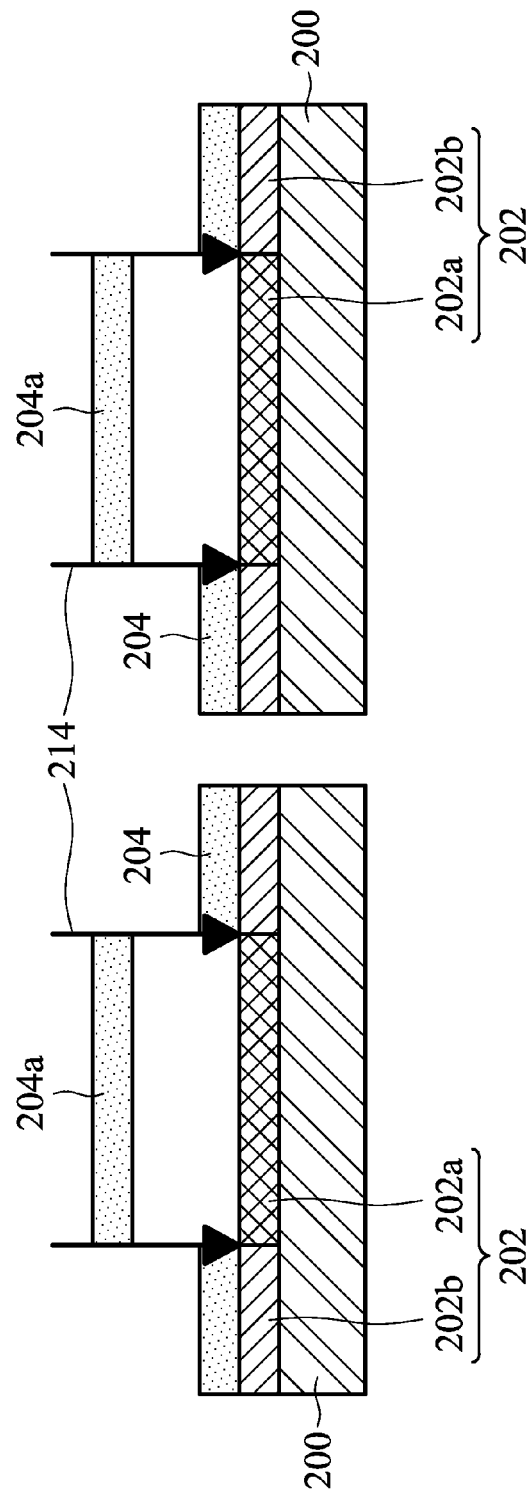

FIGS. 17 to 19 are cross sections showing still yet another exemplary embodiment of a method for patterning a flexible substrate of the disclosure. Elements of the embodiments hereinafter, that are the same or similar as those previously described with reference to FIGS. 1 to 16, are not repeated for brevity. As shown in FIG. 17, after forming the release layer 202 on the carrier substrate 200, a plurality of UV blocking mask patterns 236a is formed on various portions of the release layer 202 by a formation method comprising screen printing, spatula printing, roller coating, spray printing or spin coating. In this embodiment, the UV blocking mask patterns 236a may have functions of, for example, UV resistant or UV absorption. In one embodiment, the UV blocking mask patterns 236a may comprise inorganic materials including metals, metal oxides (such as $Al_2O_3$), silicon oxide or nitride compounds (such as SiOx or SiNx), organic materials including polymers, organic/inorganic laminating layers or organic/inorganic mixing layers. In one embodiment, the UV blocking mask patterns 236a may be a transparent film or an opaque film. In one embodiment, the UV blocking mask patterns 236a may comprise a signal layer or multilayer film. The various portions of the release layer 202 covered by the UV blocking mask patterns 236a are defined as various debonding portions for the subsequently formed flexible substrate film 204, which are separated from the carrier substrate 200 via the directly underlying portions of the release layer 202 during the subsequent debonding process.

Still referring to FIG. 17, a UV lighting process 208 is performed to expose the portions of the release layer 202 not covered by the UV blocking mask patterns 226a, to a UV light. The release layer 202 formed of organic materials absorbs UV light with a wavelength between 200 nm to 300 nm easily, but does not absorb the light with a wavelength above 400 nm. During the UV lighting process 208, a yellowing reaction occurs yellowing the portions of the release layer 202 not covered by the UV blocking mask patterns 226a.

Next, referring to FIG. 18, after performing the UV lighting process 208, the UV blocking mask patterns 226a as shown in FIG. 17 are removed. Also, after performing the UV lighting process 208, the portions of the release layer 202 not covered by the UV blocking mask patterns 226a may be transformed into UV treated release layer patterns 202b, and the portions of the release layer 202 not covered by the UV blocking mask patterns 226a may be formed as release layer patterns 202a, wherein the UV treated release layer patterns 202b and the release layer patterns 202a are connected to each other. Then, a flexible substrate film 204 is entirely formed on the release layer 202 by a formation method comprising screen printing, spatula printing, roller coating, spray printing, spin coating or slot die coating. It is noted that the UV lighting process 208 as shown in FIG. 17 locally changes the adhesion force at an interface between the release layer 202 and the flexible substrate film 204.

Still referring to FIG. 18, a cutting process 210 is performed to cut the flexible substrate film 204, the UV treated release layer pattern 202b and the carrier substrate 200 in sequence to separate the flexible substrate film 204 into independent flexible substrate films 204 with a smaller area at where the flexible substrate film 204 is exposed to the UV light. After performing the cutting process 210, each of the release layer patterns 202a which were not exposed to the UV light are separated from each other. In one embodiment, the cutting process 210 may be performed along a direction of the normal line of the carrier substrate 200. It is note that following experiments, it was shown that the UV treated release layer pattern 202b had good adhesion force with the flexible substrate film 204 thereabove. Therefore, when performing the cutting process 210, a peeling problem at the interface 212b between the UV treated release layer pattern 202b and the flexible substrate film 204 thereabove, is not likely to occur.

Next, referring to FIG. 19, a separating step 214 may be performed using a cutting tool to cut the flexible substrate film 204 along edges between the release layer patterns 202a and the UV treated release layer pattern 202b; thereby allowing air to enter into an interface 212a (as shown in FIG. 18) between the release layer patterns 202a and the flexible substrate film 204. Next, a debonding step is performed so that a plurality of flexible substrates 204a directly above the release layer patterns 202a not exposed to the UV light are separated from the carrier substrate 200. A remaining flexible substrate film 204 is left on the UV treated release layer pattern 202b due to good adhesion force therebetween. Thus, the description of still yet another exemplary embodiment of a method for patterning a flexible substrate is complete.

Exemplary embodiments provide a method for patterning a flexible substrate of the disclosure. Exemplary embodiments of a method for patterning a flexible substrate uses a plurality of UV blocking mask patterns on a release layer and the subsequent UV lighting process to locally change the adhesion force between the release layer and the flexible substrate connected to each other. Portions of the release layer covered by the UV blocking mask patterns are transformed into release layer patterns, and portions of the release layer not covered by the UV blocking mask patterns are transformed into UV treated release layer patterns due to the yellowing reaction on the release layer. Therefore, the release layer with a large area can be transformed into a plurality of release layer patterns with a smaller area, wherein the release layer patterns are separated by the UV treated release layer patterns connected to each other. Positions of the release layer patterns can be precisely controlled. Thus, the flexible substrate formed on the release layer patterns and the UV treated release layer patterns can be separated into a plurality of patterned flexible substrates with a smaller area. Exemplary embodiments of a method for patterning a flexible substrate can effectively prevent the conventional release layer patterns, which are formed by the evaporation, from diffusion and connecting with each other. Therefore, the patterned flexible substrates can maintain independency to each other. Additionally, the UV blocking mask patterns may have various functions of, for example, UV resistant or UV absorption. The UV blocking mask patterns may further have functions of electrical conduction or gas or hydraulic resistance. Therefore, the UV blocking mask patterns may be used not only for blocking UV light with a wavelength between 190 nm and 400 nm, but also used as an element of a subsequent formed flexible device, for example, a gas or hydraulic layer, an electrode or the like. Therefore, the subsequently formed flexible devices fabricated on the patterned flexible substrates have improved fabrication yield. Exemplary embodiments of a method for patterning a flexible substrate have a high throughput and are easily produced.

While the embodiments have been described, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for patterning a flexible substrate, comprising:
providing a carrier substrate;
forming a release layer on the carrier substrate;
forming a plurality of UV blocking mask patterns covering various portions of the release layer;
forming a flexible substrate film covering the UV blocking mask patterns and the release layer;
performing a UV lighting process to expose the flexible substrate film and the release layer not covered by the UV blocking mask patterns, to a UV light; and
performing a debonding step so that various portions of the flexible substrate film directly above the various portions of the release layer, which were not exposed to the UV light, are separated from the carrier substrate and the release layer.

2. The method for patterning a flexible substrate as claimed in claim 1, further comprising:
performing a cutting process to cut the flexible substrate film, the release layer and the carrier substrate in sequence at where the flexible substrate film is exposed to the UV light; and
performing a separating step to allow air to enter into an interface between the release layer covered by the UV blocking mask patterns and the carrier substrate, before performing the debonding step.

3. The method for patterning a flexible substrate as claimed in claim 1, wherein the release layer comprises the C—H functional group.

4. The method for patterning a flexible substrate as claimed in claim 1, wherein the release layer comprises parylene group materials.

5. The method for patterning a flexible substrate as claimed in claim 4, wherein the parylene group materials comprise identical recurring units of Formula 1, Formula 2 or Formula 3,

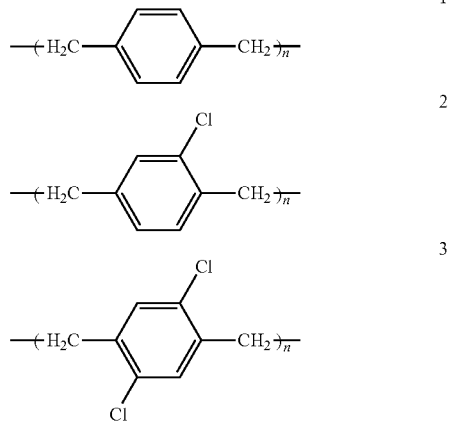

wherein n>20.

6. The method for patterning a flexible substrate as claimed in claim 1, wherein the release layer, after being exposed to the UV light, comprises the C=O functional group or the —OH functional group.

* * * * *